United States Patent
Parris et al.

(10) Patent No.: US 6,262,935 B1
(45) Date of Patent: Jul. 17, 2001

(54) SHIFT REDUNDANCY SCHEME FOR WORDLINES IN MEMORY CIRCUITS

(75) Inventors: Michael C. Parris; Kim Carver Hardee, both of Colorado Springs, CO (US)

(73) Assignees: United Memories, Inc., Colorado Springs, CO (US); Sony Corporation, Tokyo (JP)

(*) Notice: Subject to any disclaimer, the term of this patent is extended or adjusted under 35 U.S.C. 154(b) by 0 days.

(21) Appl. No.: 09/595,149

(22) Filed: Jun. 17, 2000

(51) Int. Cl.$^7$ ........................................ G11C 8/00
(52) U.S. Cl. ................ 365/230.06; 365/200; 365/189.11
(58) Field of Search .................... 365/230.06, 189.11, 365/200, 201

(56) References Cited

U.S. PATENT DOCUMENTS

| | | | |
|---|---|---|---|
| 5,008,857 | * | 4/1991 | Mizoguchi ........................ 365/200 |
| 5,379,258 | * | 1/1995 | Murakami et al. ................ 365/200 |
| 5,548,557 | * | 8/1996 | Futatsuya et al. ................ 365/200 |
| 5,574,729 | * | 11/1996 | Kinoshita et al. ................ 365/200 |
| 5,771,194 | * | 6/1998 | Maeno ............................. 365/200 |
| 5,796,662 | | 8/1998 | Kalter et al. .................... 365/200 |

* cited by examiner

*Primary Examiner*—Son Mai
(74) *Attorney, Agent, or Firm*—Cook, Alex, McFarron, Manzo, Cummings & Mehler, Ltd.

(57) ABSTRACT

Wordline row redundancy scheme circuitry includes row shift circuitry and row decoder circuitry. If row shift redundancy is not desired, the row shift circuitry applies a first row shift control signal to the row shift control line. If row shift redundancy is desired, the row shift circuit applies a second row shift control signal to the row shift control line. The signal applied to the row shift control line actuates one of first and second electronic switches. Several electronic switches are series-coupled to the first and second electronic switches. The first electronic switch is also series-coupled to a first wordline select line. The second electronic switch is also series-coupled to a second wordline select line adjacent to the first wordline select line. Row address lines are coupled to the several electronic switches to carry row address selection control signals that selectively actuate its electronic switch. A wordline driver line is also electrically coupled to the several electronic switches to carry a wordline select signal that passes through the several electronic switches when the address control signals actuate the several electronic switches. When the first electronic switch and the several electronic switch are actuated, a conductive path is formed between the first wordline select line and the wordline driver line. When the second electronic switch and the several electronic switches are actuated, a conductive path is formed between the second wordline select line and the wordline driver line.

23 Claims, 2 Drawing Sheets

SHIFT REDUNDANCY SCHEME FOR WORDLINES IN MEMORY CIRCUITS

FIELD OF THE INVENTION

The present invention relates to circuitry for memory circuits and more particularly to control circuitry for memory circuits that performs a row redundancy function to overcome the adverse effects of defective memory cells.

BACKGROUND OF THE INVENTION

Read/write memory circuits store data by a process called writing and permit the subsequent retrieval of that data by a process called reading. In a conventional memory circuit, data is stored in a plurality of storage locations arranged as an array of memory cells. Each storage location is identified by an address, which might include both a row identifier and a column identifier. The amount of data that can be stored in the cells of a memory circuit is known as the storage capacity of the circuit. Each cell is accessed by use of decoder circuitry. Column and row decoder circuitry may be used for accessing the cells of a memory circuit. In conventional memory circuits, data lines transfer the data to the storage locations during a write cycle and transfer the data from the storage locations during a read cycle.

One specific type of memory circuit is known as a random access memory circuit ("RAM"). Random access memory circuits permit the storage locations to be accessed randomly, and further permit data to be both read from and written to the storage locations of the memory circuit. RAM circuits generally come in two forms. The first form of RAM is known as a static RAM circuit ("SRAM"). A primary characteristic of an SRAM circuit is that the circuit uses latches so that the storage locations of the circuit indefinitely retain the data stored therein, provided power is connected to the circuit. The second form of RAM is known as a dynamic RAM circuit ("DRAM"). A primary characteristic of a DRAM circuit is that the circuit uses charge storing elements, such as capacitors, to retain the stored data in the storage locations, and the circuit must periodically recharge (i.e., refresh) the data in order to retain same.

As will be appreciated by those skilled in the art, on occasion, memory cells and/or memory arrays in memory circuits have one or more defects. Such defects can be the result of a variety of sources. Some defects arise due to variations during the manufacturing processes. Others are the result of problems occurring during operation of the memory circuit.

Single cell failures can be isolated and spread throughout the memory array. Alternatively, a group of defective cells can be associated with each other. When a multi-cell failure occurs, the failure of certain ones of those cells can be characterized as a wordline (or row) failure if those defective cells share a common wordline (row) address. The multi-cell failure can be characterized as a bit line (or column) failure if those defective cells share a common bit line (column) address. Such multi-cell failures can also be characterized by both.

In many cases, memory circuits can still function properly, even when they have defective cells. Once detected, defective cells can be replaced with spare cells, provided spare cells are included in the array. Including on-chip spare cells to repair cell failures is known in the art as on-chip redundancy. A typical state of the art redundancy scheme has one or more spare rows (row redundancy) and/or one or more spare columns (column redundancy). These spare rows and/or columns have fuses and programmable control circuitry responsive to the wordline (row) address or bit line (column) address of the defective row or column. The control circuitry also inhibits selection of the defective cell. From an electrical standpoint, a memory circuit repaired by way of a redundancy scheme is identical to a memory circuit without any defective cells.

Although prior art wordline redundancy schemes are useful for certain applications, they have at least three significant problems associated therewith. First, use of control circuitry that performs prior art wordline redundancy schemes sacrifices performance of the memory circuit. In this regard, memory circuits using spare elements in lieu of main elements are typically relatively slower than memory circuits without any defective cells. In particular, the wordline (row) select lines are slower for the spare elements than they are for the main elements, generally because the repaired address gets routed through fuses or additional control circuitry.

Second, use of control circuitry that performs prior art wordline redundancy schemes results in area penalty. In particular, under prior art wordline redundancy schemes, fuses on the row decoder pitches are typically necessary to decode the row addresses of wordlines having defective memory cells and to disable those row addresses. At least one fuse is typically required for each wordline driver to selectively disable same, as desired. Because these fuses take up a relatively large space, a relatively large area is required for the memory array.

Third, and related to the second limitation of the prior art wordline redundancy schemes, use of control circuitry that performs prior art wordline redundancy schemes typically requires a relatively large fuse count. Furthermore, a relatively large amount of data indicative of information regarding each fuse must be stored, including its location and its corresponding memory address. With modem DRAMs having storage capacities in the gigabit order, it will be appreciated that a relatively large number of fuses are required for row decoder pitches, and a relatively large amount of data must be stored and readily accessible.

An object of the preferred forms of the invention is to overcome the above-recited problems of prior art wordline redundancy schemes.

Another object of the preferred forms of the invention is to provide a new and improved wordline redundancy scheme to overcome the adverse effects of defective memory cells.

Yet another object of the preferred forms of the invention is to provide a wordline redundancy scheme that shifts the addressing of wordlines around a defective or bad memory cell.

These and other objects of the preferred forms of the invention will become apparent from the following description. It will be understood, however, that an apparatus could still appropriate the invention claimed herein without accomplishing each and every one of these objects, including those gleaned from the following description. The claims, not the objects, define the subject matter of the invention. Any and all objects are derived from the preferred forms of the invention, not necessarily the invention in general.

SUMMARY OF THE INVENTION

The present invention is directed to wordline row redundancy scheme circuitry including a row shift circuit and a row decoder circuit electrically coupled to the row shift circuit by a row shift control line. If row shift redundancy is not desired for a particular wordline, the row shift circuit applies a first row shift control signal to the row shift control line. If row shift redundancy is desired for that wordline, the row shift circuit applies a second row shift control signal to the row shift control line. The first and second row shift control signals have distinguishing characteristics. The signal applied to the row shift control line selectively actuates one of first and second electronic switches. At least one electronic switch is coupled in series to the first and second electronic switches. The first electronic switch is also electrically coupled in series to a first wordline select line. The second electronic switch is also electrically coupled in series to a second wordline select line corresponding to a wordline adjacent to the wordline corresponding with the first wordline select line. A row address line is electrically coupled to the at least one electronic switch to carry a row address selection control signal that selectively actuates the at least one electronic switch. A wordline driver line is also electrically coupled to the at least one electronic switch to carry a wordline select signal that passes through the at least one electronic switch when the address control signal actuates the at least one electronic switch. When the first electronic switch and the at least one electronic switch are actuated, a conductive path is formed between the first wordline select line and the wordline driver line. When the second electronic switch and the at least one electronic switch are actuated, a conductive path is formed between the second wordline select line and the wordline driver line.

The present invention is also directed to a method of providing a wordline redundancy scheme for memory circuits. In accordance with that method, a defective memory cell included within a wordline is detected. A row shift control signal responsive to detection of the defective memory cell is generated to cause actuation of control circuitry that shifts the wordline select signal to an adjacent wordline select line by forming a conductive path between a wordline driver line and the adjacent wordline select line.

BRIEF DESCRIPTION OF THE DRAWINGS

In describing the illustrative embodiments of the present invention, reference is made to the accompanying drawings wherein like reference numerals identify like parts, and wherein.

DETAILED DESCRIPTION OF THE ILLUSTRATIVE EMBODIMENTS

Figure 1:
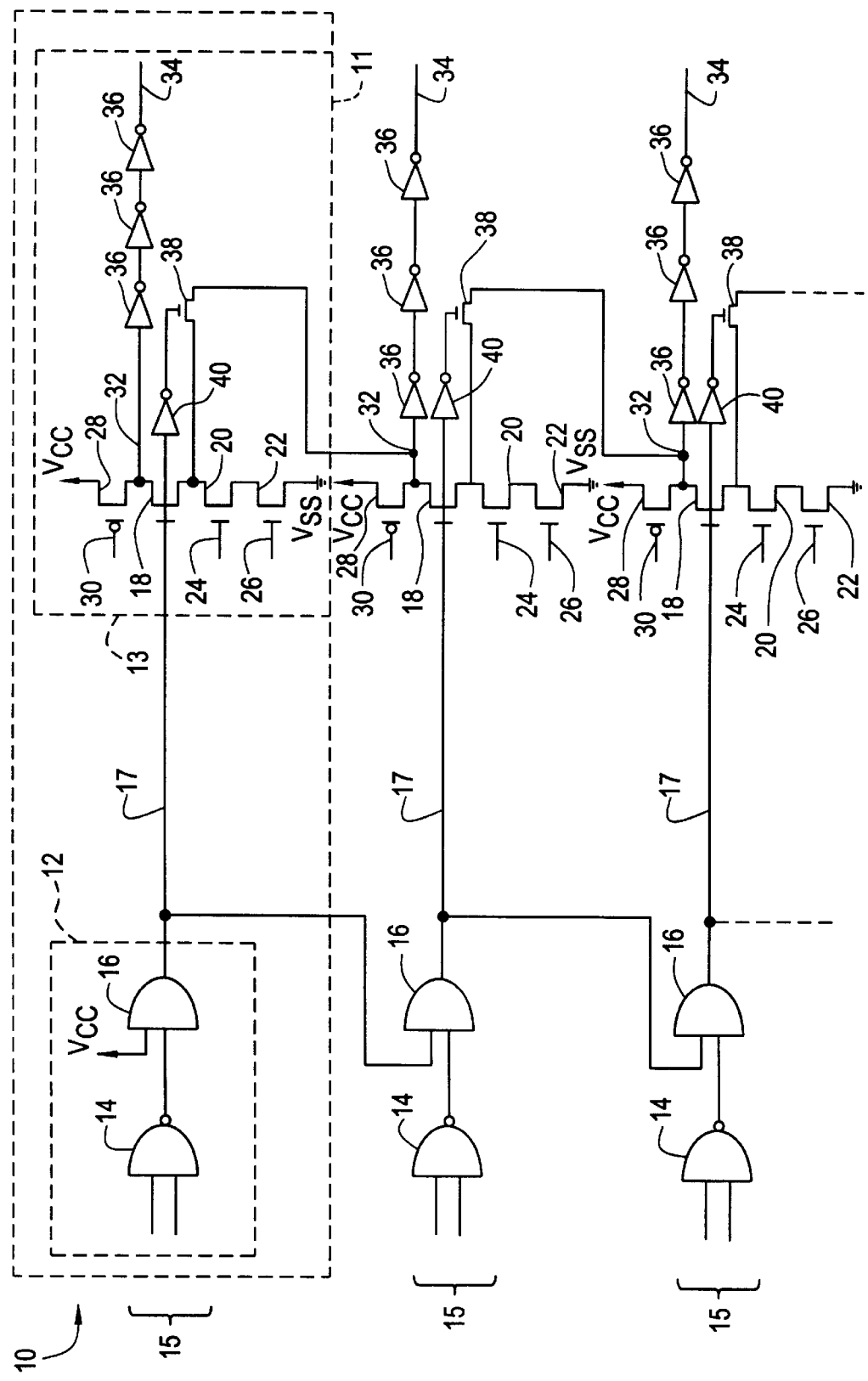
FIG. 1 is a circuit schematic diagram illustrating a first embodiment of a control circuit for a memory circuit that carries out a unique wordline redundancy scheme for the memory circuit.

FIG. 1 illustrates a control circuit generally designated 10 included as part of, or in association with, a memory circuit. Control circuit 10 carries out a unique wordline redundancy scheme for the memory circuit by shifting the addressing of wordlines around a defective memory element or cell of the memory circuit.

Control circuit 10 includes circuit components associated with each wordline selection circuit 11 of the memory circuit. Each wordline selection circuit 11 includes a row shift circuit 12 and a row decoder circuit 13, both shown in FIG. 1 for the first wordline selection circuit. Each row shift circuit 12 preferably includes a NAND gate 14 having input lines 15 adapted to carry signals indicative of a spare or repair address for the memory circuit. It will be understood that the input lines 15 for each wordline selection circuit 11 are preferably electrically coupled to a fuse bank and associated control circuitry (not shown) for setting the spare or repair address control signals carried by input lines 15.

A two-input AND gate 16 is also preferably included for each row shift circuit 12. One input of AND gate 16 is preferably electrically coupled to the output of NAND gate 14. The other input of AND gate 16 is preferably electrically coupled to the output of the AND gate 16 associated with the row shift circuit 12 of an adjacent wordline selection circuit 11, except in the case of the end wordline selection circuit (first or last). As shown, in the case of that end wordline selection circuit 11, the second input of its AND gate 16 is preferably electrically coupled to a power supply having a standard HIGH potential level, which is indicated generally by those skilled in the art as Vcc. Having its inputs coupled to the output of NAND gate 14 and Vcc, respectively, it will be understood that the signal present on the output of the AND gate 16 included in the row shift circuit 12 of this end wordline selection circuit 11 will "follow" and therefore correspond to the signal present on the output of its NAND gate 14.

As shown in FIG. 1, for each wordline selection circuit 11, a shift control line 17 electrically couples its row shift circuit 12 with its row decoder circuit 13. The row decoder circuit 13 for each wordline selection circuit 11 preferably includes a transistor 18, shown illustratively as an NMOS device. For each wordline selection circuit 11, the control electrode of transistor 18 (i.e., its gate terminal) is preferably electrically coupled to the output of AND gate 16 by shift control line 17, and, as indicated above, is also preferably electrically coupled to an input for the AND gate 16 associated with an adjacent wordline selection circuit 11. Each wordline selection circuit 11 further preferably includes one or more additional series-coupled transistors, shown illustratively as transistors 20, 22. For illustrative purposes, transistors 20, 22 are shown as NMOS devices. A wordline address bit line 24 is preferably electrically coupled to the control electrode of transistor 20. Similarly, a wordline address bit line 26 is preferably electrically coupled to the control electrode of transistor 22.

FIG. 1 shows transistor 20 as being coupled to transistor 18 in series at one of its electrodes and shows it as being coupled to transistor 22 in series at another of its electrodes. Transistor 22 is shown as being coupled to a reference voltage (i.e., ground or Vss).

The row decoder circuit 13 for each wordline selection circuit 11 also preferably includes a transistor 28, shown illustratively as a PMOS device. Transistor 28 is preferably coupled at its control electrode to a precharge control line 30. At its other two electrodes, transistor 28 is preferably coupled to Vcc and to transistor 18 in series, respectively. An output node 32 is formed at the junction between transistors 28 and 18. A wordline select line 34 is preferably coupled to output node 32 through preferably one or more series-coupled inverters 36. Inverters 36 perform a voltage level-shifting function to drive the voltage on wordline select line 34 to its desired voltage level.

The row decoder circuit 13 for each wordline selection circuit 11 also preferably includes a transistor 38, shown illustratively as an NMOS device. The control electrode of transistor 38 preferably is electrically coupled to the output of AND gate 16 and shift control line 17 through an inverter 40. One of its other electrodes is preferably electrically coupled to the junction between transistor 18 and transistor 20, while another of its other electrodes is preferably electrically coupled to the output node 32 associated with an adjacent wordline selection circuit 11.

In operation, control circuit 10 shifts the addressing of wordlines around a defective memory element or cell of the memory circuit. During a precharge stage, each wordline select line 34 is precharged to carry a signal indicative of the precharge state. In the case of the control circuit 10 shown in FIG. 1, each wordline select line 34 is precharged to carry a relatively LOW voltage signal approximating Vss potential.

When the memory elements associated with a particular wordline are functional, the address associated therewith can access that wordline to store and/or retrieve data. Because it is not necessary to shift the wordline address, at least one of the input lines 15 included within row shift circuit 12 will carry a relatively LOW voltage signal approximating Vss potential. It will be understood that the signals carried on this and other input lines 15 will be set by a fuse bank and additional control circuitry (not shown). It will further be appreciated that although a fuse bank is used, the current wordline redundancy scheme circuitry 10 requires substantially less fuses than prior art wordline redundancy scheme circuitry.

Under the foregoing conditions where at least one of the input lines 15 for a particular wordline carries a relatively LOW voltage signal, the output of NAND gate 14 for that wordline, which is electrically coupled to an input of AND gate 16 for that wordline, will be set to a relatively HIGH voltage level. Assuming for the moment that the other input for AND gate 16 also carries a relatively HIGH voltage signal, shift control line 17, which is electrically coupled to the output of AND gate 16, will carry a relatively HIGH voltage signal approximating Vcc potential. As a result, one input for AND gate 16 included within the row shift circuit 12 of the wordline selection circuit 11 for an adjacent wordline is driven to a relatively HIGH voltage level. Furthermore, transistor 18 is enabled (i.e., turned ON), and transistor 38 is disabled (i.e., turned OFF).

Under such circumstances, wordline select line 34 for a particular wordline transitions from its precharged LOW state to a HIGH voltage level approximating Vcc potential when the wordline address bit lines 24, 26 for that wordline each carry a relatively HIGH voltage signal and turn transistors 20, 22 ON. Wordline select line 34 is then used to select that wordline for reading from and/or writing to that wordline, or is electrically coupled to additional control circuitry (not shown) for carrying out that selection. It will be appreciated that wordline address bit lines 24, 26 for a particular wordline carry relatively HIGH voltage signals when it is desired that that wordline be selected for the reading or writing operation. It will further be appreciated that such signals are provided by additional row selection control circuitry not shown in FIG. 1.

When the memory elements associated with a particular wordline are defective, the address corresponding with that wordline can be shifted to selectively enable the next available wordline, as desired. Under such circumstances, all of the input lines 15 associated with the bad wordline having defective elements carry relatively HIGH voltage signals approximating Vcc potential. These input lines 15 indicate that the wordline associated with that row address has one or more defective elements. Again, the signals carried on this and other input lines 15 are set by a fuse bank and additional control circuitry (not shown).

Under these circumstances, the output of the NAND gate 14 included within the row shift circuit 12 for the bad wordline will carry a relatively LOW voltage signal, causing the signal on its associated shift control line 17 to be held at a relatively LOW voltage level. Because each shift control line 17 is preferably electrically coupled to an input of the AND gate 16 associated with the selection circuit for the next wordline, each subsequent shift control line 17 will also be held at a relatively LOW voltage level.

For each such wordline having its associated shift control line 17 held at a relatively LOW voltage signal, its associated transistor 18 will be turned OFF, while its associated transistor 38 will be turned ON. As a result, the defective wordline will no longer be selected, and all subsequent wordlines will be controlled and selected by the row address for its preceding wordline. This will be accomplished by applying relatively HIGH voltage signals to the wordline address bit lines 24, 26 associated with the selection circuit for the preceding wordline, which, in turn, will cause the wordline select line 34 for the adjacent, selected wordline to transition from its precharged LOW voltage level to a HIGH voltage level indicating that its corresponding wordline is to be accessed for the contemporaneously occurring read or write operation.

Figure 2:
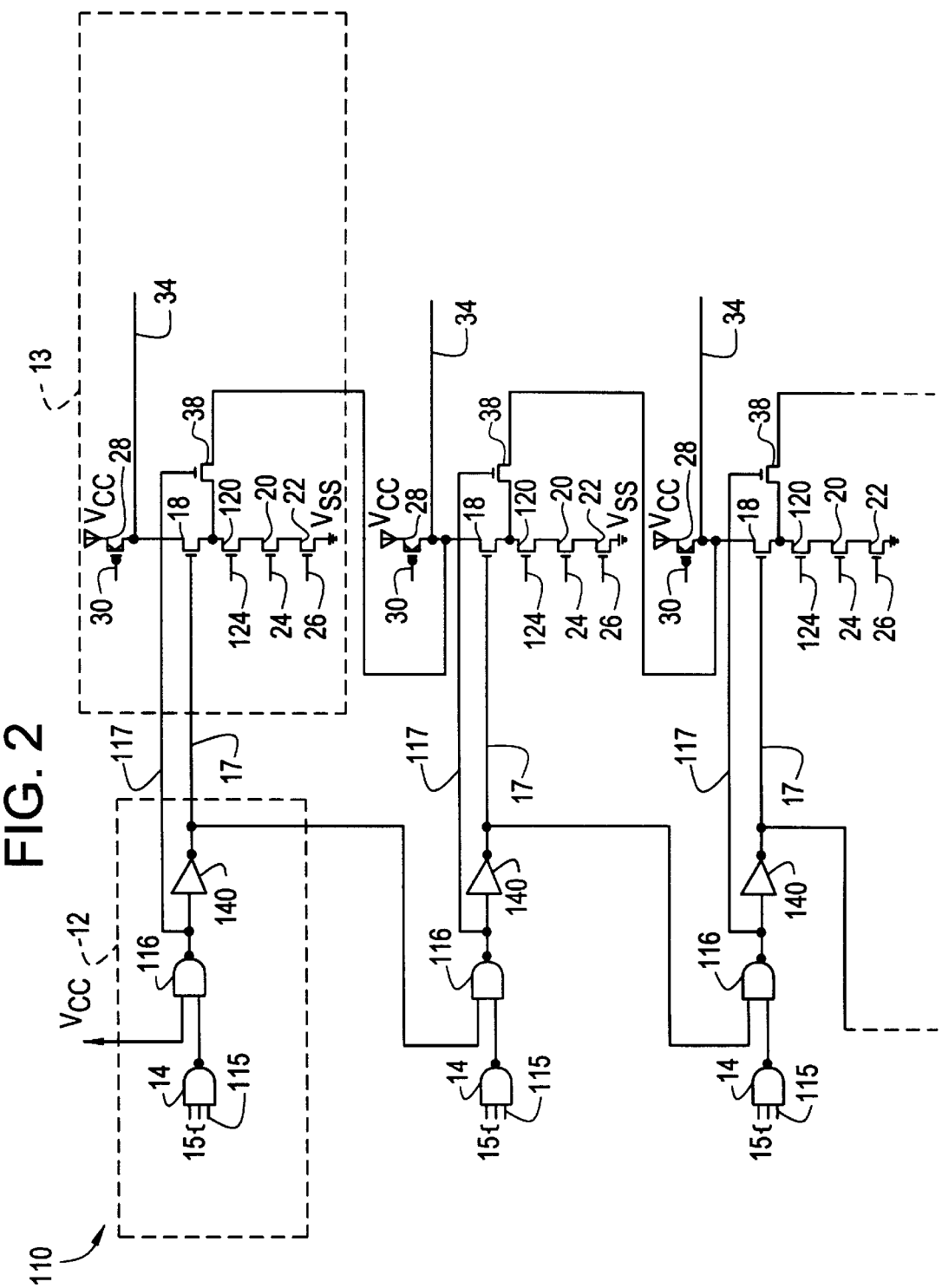
FIG. 2 is a circuit schematic diagram illustrating a second embodiment of a control circuit for a memory circuit that carries out a unique wordline redundancy scheme for the memory circuit.

FIG. 2 illustrates a second embodiment for the control circuit, which in FIG. 2 is generally designated by reference numeral 110. Control circuit 110 shown in FIG. 2 is almost identical in structure and function to the control circuit 10 shown in FIG. 1. The noted differences are that, for each wordline selection circuit: (1) AND gate 16 of FIG. 1 has been replaced by a NAND gate 116 in FIG. 2; (2) inverter 40 in FIG. 1 has been removed because of the change noted above; (3) similarly, an inverter 140 has been added in series between the output of NAND gate 116 and the control electrode for transistor 18; (4) an additional shift control line 117 preferably electrically couples the output of NAND gate 116 with the control electrode of transistor 38; (5) the level-shifting inverters 36 have been removed, but could preferably be provided in subsequent stages of the row decoder control circuitry (not shown); and (6) an additional wordline address bit line 124 and transistor 120 are included, along with an additional spare address line 115, but it will be appreciated that the number of wordline address bit lines and spare address bit lines will depend on the particular addressing scheme used for the memory circuit and whether any additional control circuitry in the form of a predecoder circuit is used in the application.

While this invention has been described with reference to two illustrative embodiments, it will be understood that this description shall not be construed in a limiting sense. Rather, various changes and modifications can be made to the illustrative embodiments without departing from the true spirit and scope of the invention, as defined by the following claims. Furthermore, it will be appreciated that any such changes and modifications would be recognized by those skilled in the art as an equivalent to one element or more of the following claims, and shall be covered by such claims to the fullest extent permitted by law.

What is claimed is:

1. A wordline row redundancy scheme circuitry, comprising:

a row shift circuit;

a row decoder circuit electrically coupled to the row shift circuit by a row shift control line;

said row shift circuit configured to apply a first row shift control signal level to the row shift control line, in the event that row shift redundancy is not desired;

said row shift circuit configured to apply a second row shift control signal level to the row shift control line, in the event that row shift redundancy is desired, said first and second row shift control levels have distinguishing characteristics;

a first electronic switch, responsive to said first row shift control signal, electrically coupled in series between an address selection electronic switch and a first wordline select line; and a second electronic switch, responsive to said second row shift control signal, electrically coupled in series between said address selection electronic switch and a second wordline select line.

2. The wordline row redundancy scheme circuitry as defined by claim 1 wherein said first wordline select line corresponds with a first wordline address, said second wordline select line corresponds with a second wordline address, and said first wordline address is adjacent to said second wordline address.

3. The wordline row redundancy scheme circuitry as defined by claim 1 further comprising an additional address selection electronic switch electrically coupled in series to said address selection electronic switch.

4. The wordline row redundancy scheme circuitry as defined by claim 1 wherein said row shift circuit is responsive to control signals corresponding to a spare row address.

5. The wordline row redundancy scheme circuitry as defined by claim 1 wherein said row decoder circuit includes a precharge circuit.

6. The wordline row redundancy scheme circuitry as defined by claim 5 wherein said precharge circuit includes a precharge electronic switch.

7. The wordline row redundancy scheme circuitry as defined by claim 6 wherein said precharge electronic switch comprises a transistor.

8. The wordline row redundancy scheme circuitry as defined by claim 1 wherein said row decoder circuit includes a plurality of level-shifting inverters.

9. The wordline row redundancy scheme circuitry as defined by claim 1 wherein said first electronic switch comprises a transistor.

10. The wordline row redundancy scheme circuitry as defined by claim 1 wherein said second electronic switch comprises a transistor.

11. The wordline row redundancy scheme circuitry as defined by claim 1 wherein said address selection switch comprises a transistor.

12. A wordline row redundancy scheme circuitry, comprising:

a row shift circuit having row shift circuit input lines, row shift circuit control circuitry, and a row shift circuit output line corresponding with a row shift control line;

the row shift circuit input lines being adapted to carry electrical signals indicative of a spare wordline address;

a row decoder circuit electrically coupled to the row shift circuit by the row shift control line, the row shift circuit configured to apply a first row shift control signal level to the row shift control line, in the event that row shift redundancy is not desired and configured to apply a second row shift control signal level to the row shift control line, in the event that row shift redundancy is desired, said first and second row shift control signal levels have distinguishing characteristics;

a first transistor, responsive to said first row shift control signal, having a first transistor control electrode electrically coupled to the row shift control line, the first transistor further being electrically coupled in series between an address selection transistor and a first wordline select line; and a second transistor, responsive to said second row shift control signal, having a second transistor control electrode electrically coupled to the row shift control line, the second transistor further being electrically coupled in series between said address selection transistor and a second wordline select line.

13. The wordline row redundancy scheme circuitry as defined by claim 12 wherein said first wordline select line corresponds with a first wordline address, said second wordline select line corresponds with a second wordline address, and said first wordline address is adjacent to said second wordline address.

14. The wordline row redundancy scheme circuitry as defined by claim 12 further comprising an additional address selection transistor electrically coupled in series to said address selection transistor.

15. The wordline row redundancy scheme circuitry as defined by claim 12 wherein said row decoder circuit includes a precharge circuit.

16. The wordline row redundancy scheme circuitry as defined by claim 15 wherein said precharge circuit includes a precharge transistor.

17. The wordline row redundancy scheme circuitry as defined by claim 16 wherein said precharge electronic switch comprises a field effect transistor.

18. The wordline row redundancy scheme circuitry as defined by claim 12 wherein said row decoder circuit includes a plurality of level-shifting inverters.

19. The wordline row redundancy scheme circuitry as defined by claim 12 wherein said first transistor comprises a field effect transistor.

20. The wordline row redundancy scheme circuitry as defined by claim 12 wherein said field effect transistor comprises an NMOS device.

21. The wordline row redundancy scheme circuitry as defined by claim 12 wherein said second transistor comprises a field effect transistor.

22. The wordline row redundancy scheme circuitry as defined by claim 12 wherein said address selection transistor comprises a field effect transistor.

23. A method of performing a shift row redundancy scheme for a memory circuit, comprising the steps of:

(a) detecting a defective memory cell included within a wordline of the memory circuit;

(b) generating a row shift control signal for a wordline address selection control circuit associated with the wordline having the defective memory cell in response to detection of the defective memory cell;

(c) actuating control circuitry associated with said wordline having the defective memory cell based upon generation of said row shift control signal; and (d) shifting the wordline select signal for said wordline to a wordline select line associated with an adjacent wordline by forming a conductive path between a wordline driver line associated with said wordline and said wordline select line associated with said adjacent wordline.

* * * * *